(12) United States Patent
Ben Jamaa et al.

(10) Patent No.: US 9,240,394 B1
(45) Date of Patent: Jan. 19, 2016

(54) STACKED CHIPS ATTACHED TO HEAT SINK HAVING BONDING PADS

(71) Applicant: Commissariat à l'énergie atomique et aux énergies alternatives, Paris (FR)

(72) Inventors: Haykel Ben Jamaa, Grenoble (FR); Laurent Fulbert, Voiron (FR); Sylvie Menezo, Voiron (FR); Gilles Poupon, Seyssinet Pariset (FR)

(73) Assignee: Commissariat à l'energie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/747,136

(22) Filed: Jun. 23, 2015

(30) Foreign Application Priority Data

Jun. 25, 2014 (FR) ...................... 14 55936

(51) Int. Cl.
*H01L 23/10* (2006.01)
*H01L 21/00* (2006.01)
*H01L 25/065* (2006.01)
*H01L 23/367* (2006.01)
*H01L 23/31* (2006.01)
(Continued)

(52) U.S. Cl.
CPC ........ *H01L 25/0657* (2013.01); *H01L 23/3107* (2013.01); *H01L 23/367* (2013.01); *H01L 23/3675* (2013.01); *H01L 23/473* (2013.01); *H01L 24/32* (2013.01); *H01L 24/83* (2013.01); *H01L 25/0756* (2013.01); *H01L 25/50* (2013.01); *H01L 21/56* (2013.01); *H01L 23/28* (2013.01); *H01L 2224/32245* (2013.01); *H01L 2224/8389* (2013.01); *H01L 2224/83851* (2013.01); *H01L 2225/06555* (2013.01); *H01L 2225/06589* (2013.01); *H01L 2924/14* (2013.01)

(58) Field of Classification Search
CPC ... H01L 23/345; H01L 23/28; H01L 25/0756; H01L 25/0657; H01L 23/367; H01L 21/56; H01L 33/64; H01L 25/072
See application file for complete search history.

(56) References Cited

U.S. PATENT DOCUMENTS 6,265,771 B1 * 7/2001 Ference et al. ............... 257/706
7,863,090 B2 * 1/2011 Eichelberger et al. ....... 438/106
(Continued)

FOREIGN PATENT DOCUMENTS

EP 1271649 1/2003
FR 2999336 6/2013
(Continued)

OTHER PUBLICATIONS

Szekely et al., "Tracing the Thermal Behavior of ICs," IEEE Design & Test of Computers, pp. 14-21, Apr.-Jun. 1998.
(Continued)

*Primary Examiner* — Alonzo Chambliss
(74) *Attorney, Agent, or Firm* — Occhiuti & Rohlicek LLP (57) ABSTRACT

An integrated circuit comprises a heat sink devoid of electronic components and interposed between a back side of a bottom electronic chip and an upper exterior side of an encapsulation, the sink comprising a front side placed on the back side of the bottom electronic chip. The back side of the bottom electronic chip comprises pads and the front side of the sink comprises pads mechanically fastened to facing pads of the back side of the bottom electronic chip.

15 Claims, 4 Drawing Sheets

(51) Int. Cl.
*H01L 23/473* (2006.01)
*H01L 25/00* (2006.01)
*H01L 23/00* (2006.01)
*H01L 25/075* (2006.01)
H01L 23/28 (2006.01)
H01L 21/56 (2006.01)

(56) References Cited

U.S. PATENT DOCUMENTS

| | | | |
|---|---|---|---|
| 7,956,625 B1 | 6/2011 | Portune | |
| 8,193,625 B2 * | 6/2012 | Liu et al. | 257/686 |
| 8,358,017 B2 * | 1/2013 | Tsui | 257/778 |
| 8,564,119 B2 * | 10/2013 | Eichelberger et al. | 257/706 |
| 8,937,385 B2 | 1/2015 | Ben Jamaa et al. | |
| 9,028,138 B2 | 5/2015 | Ben Jamaa et al. | |
| 2006/0039118 A1 | 2/2006 | Jafari et al. | |
| 2008/0225489 A1 | 9/2008 | Cai et al. | |
| 2008/0237840 A1 | 10/2008 | Alcoe et al. | |
| 2009/0127700 A1 | 5/2009 | Romig | |
| 2009/0194868 A1 * | 8/2009 | Chong et al. | 257/712 |
| 2011/0031610 A1 * | 2/2011 | Yamazaki et al. | 257/693 |
| 2011/0045300 A1 | 2/2011 | Tamaoki et al. | |
| 2013/0043581 A1 | 2/2013 | Negoro | |

FOREIGN PATENT DOCUMENTS

FR 2984008 6/2014
JP 2013/008748 1/2013

OTHER PUBLICATIONS

Subrina et al., "Heat Removal in Silicon-on-Insulator Integrated Circuits with Graphene Lateral Heat Spreaders," IEEE Electron Device Letters, vol. 30, No. 12, pp. 1281-1283 Dec. 2009.

Quagan, Robert J., "Laser Diode Heat Spreaders: Thermal Management Materials for Photonics and Electronic Packaging," Ion Beam Milling, Inc., pp. 1-9.

Poupon et al., "3D Integration: A Technological Toolbox," IEEE, pp. 375-378 (2008).

T. Brunschwiler, et al. "Angle-of-Attack Investigation of Pin-Fin Arrays in Nonuniform Heat-Removal Cavities for Interlayer Cooled Chip Stacks" Franhofer Institute for Reliability and Microintegration. $27^{th}$ IEEE Semi-Therm Symposium (2011).

X. Q. Chen, et al. "Aligning single-wall carbon nanotubes with an alternating-current electric field" Applied Physics Letters vol. 27, No. 23 (Jun. 4, 2001).

E. Hammel, et al. "High Thermal Performance Silicon Heat Spreaders with Microwhisker Structure" IEEE/CPMT Int'l Manufacturing Technology Symposium. pp. 426-432. (1999).

Kaustav Banerjee, et al. "On Thermal Effects in Deep Sub-Micron VLSI Interconnects" Department of Electrical Engineering and Computer Sciences, University of California, Berkeley. (1999).

* cited by examiner

STACKED CHIPS ATTACHED TO HEAT SINK HAVING BONDING PADS

RELATED APPLICATIONS

Under 35 USC 119, this application claims the benefit of the Jun. 25, 2014 priority date of French Patent Application FR 1455936, the content of which is herein incorporated by reference in its entirety.

FIELD OF INVENTION

The invention relates to an integrated circuit comprising a heat sink. The invention also relates to an assembly comprising this integrated circuit and to a process for fabricating this integrated circuit.

BACKGROUND

The trend over the last few decades has been to increase the functionality of integrated circuits by reducing lithographic dimensions following Moore's law. For less than a decade, it has also been feasible to add functionalities to integrated circuits using the possibilities offered by integration in the vertical dimension, this being referred to as 3-D integration. This increase in integration density in the three available dimensions of integrated circuits has had the direct effect of increasing power density, leading to an increase in transistor junction temperatures and, in general, electronic chip operating temperatures.

Thus, known integrated circuits comprise:

a substrate that extends mainly in a plane referred to as the "plane of the substrate", this substrate being equipped with electrical connections for electrically connecting the integrated circuit to an exterior electronic circuit and having an interior side;

a top electronic chip and a bottom electronic chip, each of these electronic chips being electrically connected to the electrical connections by way of the substrate and each electronic chip comprising a front side turned toward the interior side of the substrate and a back side opposite the front side, the back side of the top electronic chip being located at a height H above the interior side of the substrate and being further from the interior side of the substrate than the back side of the bottom electronic chip; and an encapsulation formed by a thick layer made of an electrically insulating material that coats the electronic chips, this thick layer forming an upper exterior side of the encapsulation parallel to the plane of the substrate.

Such integrated circuits are cooled via their upper exterior side. For example, for this purpose, a cooling system is fastened to this upper exterior side.

However, the bottom electronic chip is less well cooled than the top electronic chip because it is further from the upper exterior side. Under these conditions, to prevent the bottom electronic chip from becoming too hot, one solution consists in over-specifying the cooling system of the upper exterior side in order to take account of this distance to the bottom electronic chip. Another solution consists in doing nothing and in making allowance for the fact that the bottom electronic chip is less well cooled than the top electronic chip. Lastly, other solutions consist in inserting a heat sink, devoid of electronic components, between the back side of the bottom electronic chip and the upper exterior side of the encapsulation. This sink comprises a front side that is placed on the back side of the bottom electronic chip, and a back side opposite the front side, this back side being located on the same level as the back side of the top electronic chip. Examples of this last solution are described in patent applications US 2009/127700 A1 and JP 2013/008748 A. However, integration of a heat sink above the bottom electronic chip complexifies the fabrication of the integrated circuit.

Prior art is also known from: US 2013/043581 A1, EP 1 271 649 A2, US 2006/039118 A1 and US 2008/237840 A1.

SUMMARY OF INVENTION

The invention aims to remedy this drawback by providing an integrated circuit that comprises a heat sink that allows the bottom electronic chip to be better cooled without however excessively complexifying production of the integrated circuit.

One of its subjects is therefore an integrated circuit as claimed in claim 1.

By virtue of the presence in the interior of the integrated circuit of the heat sink, which compensates for the height difference between the back sides of the top and bottom chips, a thermal bridge is established between the back side of the bottom electronic chip and the upper exterior side. This very substantially improves the cooling of the bottom electronic chip from the upper exterior side. Thus, it is no longer necessary to over-specify as much the cooling system of the upper exterior side in order to obtain the same cooling of the bottom electronic chip as in known integrated circuits.

In addition, the presence of pads on the front side of the sink and on the back side of the bottom electronic chip simplifies integration of the heat sink into the integrated circuit. Specifically, it is then possible to use conventional processes for fastening an electronic chip to facing pads to fasten the heat sink to the back side of the bottom electronic chip. This therefore greatly simplifies integration of this sink into the integrated circuit since it is not necessary to implement to do this a specific process for fastening the sink to the bottom electronic chip.

The embodiments of this integrated circuit may have one or more of the features of the dependent claims.

The embodiments of this integrated circuit furthermore have the following advantages:

the presence of pads on the sink, which are identical to the pads already used to connect electrically the top electronic chip, makes it possible to simplify the fastening of the sink to the back side of the bottom electronic chip, because the same fastening process is used both for the top electronic chip and the sink;

making provision for the sink to have a flat front side makes it possible to ensure a larger area of contact with the back side of the bottom electronic chip and therefore to improve the effectiveness of the cooling of the bottom electronic chip;

having an area of mechanical contact between the front side of the sink and the back side of the bottom electronic chip larger than 10% of the area of the orthogonal projection of this back side makes it possible to increase the effectiveness of the cooling of the bottom electronic chip; and making the area of the orthogonal projection of the front side of the sink strictly larger than the area of the orthogonal projection of the back side of the bottom electronic chip makes it possible to increase lateral diffusion of heat and therefore to increase the effectiveness of the cooling of the bottom electronic chip.

Another subject of the invention is an assembly comprising:

the above integrated circuit having an upper exterior side; and a radiator or a fluidic cooling system using a heat-transfer fluid to cool the upper exterior side of the integrated circuit, the radiator or the fluidic cooling system being placed directly on the upper exterior side of the integrated circuit.

Another subject of the invention is a process for fabricating the above integrated circuit.

The embodiments of this fabrication process may comprise one or more of the features of the dependent claims.

The invention will be better understood on reading the following description, given merely by way of nonlimiting example and with reference to the drawings

DETAILED DESCRIPTION

In these figures, the same references are used to designate the same elements. In the rest of this description, features and functions well known to those skilled in the art will not be described in detail.

Figures 1, 2, 3, 4, 5, 6:
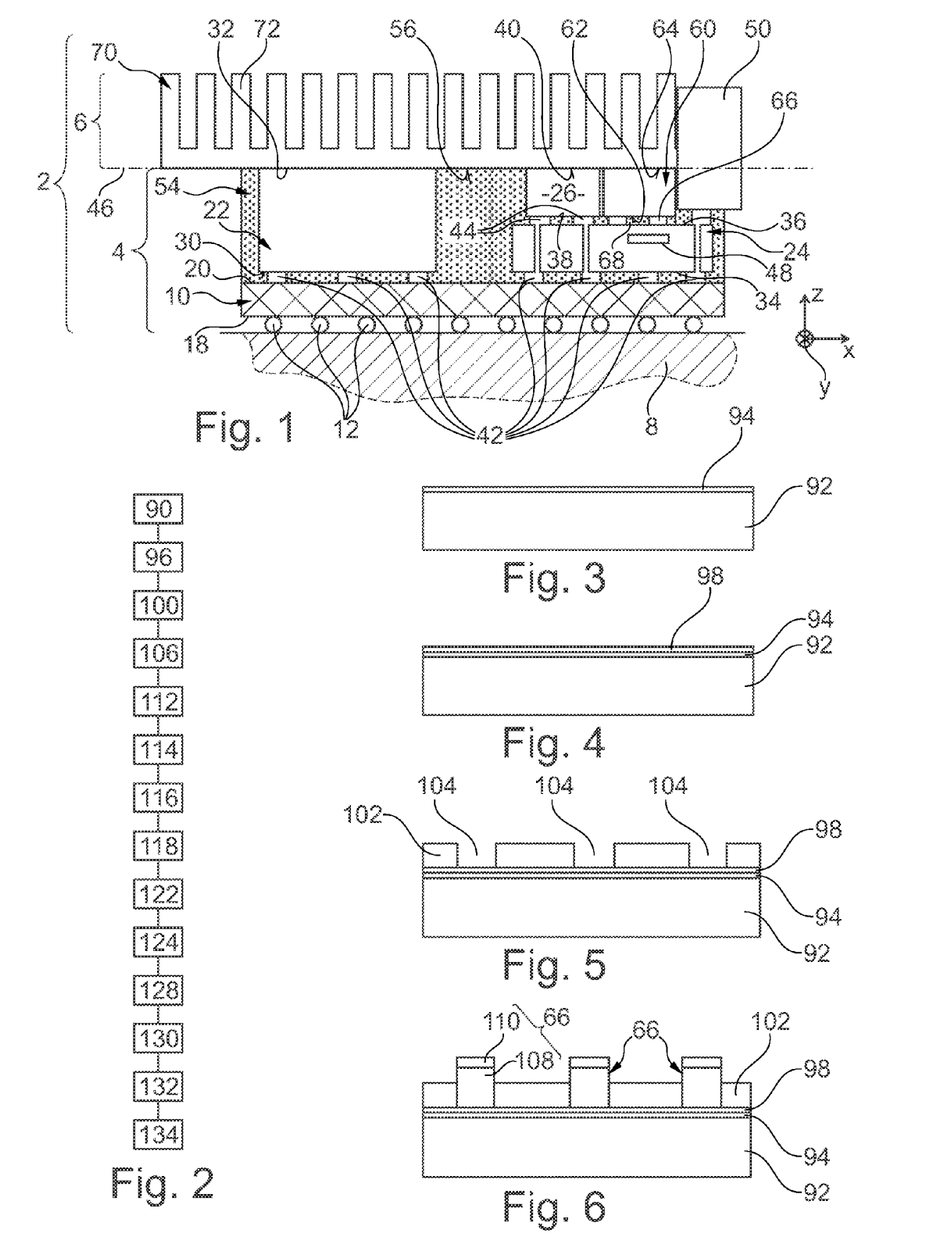
FIG. 1 is a schematic illustration of a vertical cross section through an assembly comprising an integrated circuit and a system for cooling this integrated circuit.
FIG. 2 is a flowchart of a process for fabricating the assembly in FIG. 1.
FIGS. 3 to 13 are schematic illustrations of vertical cross sections illustrating various steps of the fabrication process in FIG. 2.
Figure 7:
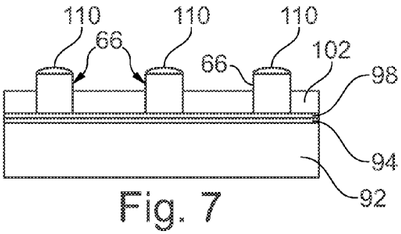
Figure 8:
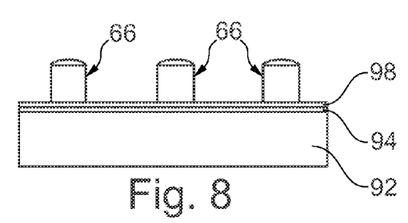

FIG. 1 shows an assembly 2 comprising an integrated circuit 4 and a system 6 for cooling this integrated circuit 4.

The integrated circuit 4 is designed to process signals in order to provide one or more preset functions. The processed signals are electrical or optical signals.

This integrated circuit 4 is electrically connected to an exterior electronic circuit. Typically, it is mounted on a printed circuit board 8 of the exterior electronic circuit. In FIG. 1, only one portion of the printed circuit board 8 is shown. For this purpose, the integrated circuit 4 comprises a substrate 10 equipped with electrical connections 12. The connections 12 electrically and mechanically connect the integrated circuit 4 to electrical tracks of the printed circuit board 8. In FIG. 1, the tracks of the printed circuit board 8 have not been shown.

The substrate 10 essentially extends horizontally parallel to a plane referred to as "the plane of the substrate". The plane of the substrate is parallel to orthogonal directions X and Y. The vertical direction is shown in the figures by a direction Z perpendicular to the directions X and Y. Here, terms such as "above", "below", "upper" and "lower" are defined relative to the direction Z.

The connections 12 are, for example, fusible bumps located on a horizontal exterior side 18 of the substrate 10. The exterior side 18 is located opposite a horizontal interior side 20. The fusible bumps are soldered to corresponding tracks of the printed circuit board 8. Such electrical connections are also known as "micro-pillars". This bump array is known by the acronym BGA (for Ball Grid Array). The bumps are, for example, made of a conductive metal such as copper, mixed with a wetting material such as tin.

The substrate 10 also comprises electrical tracks electrically connecting connection pads of the electronic chips to respective connections 12. To simplify FIG. 1, these electrical tracks of the substrate 10 have not been shown.

Typically, the substrate 10 is made of a hard material the hardness of which is for example higher than or equal to that of silicon. Here, the substrate 10 is made of silicon. The thickness of the substrate 10 is typically larger than 100 µm or 300 µm.

The integrated circuit 4 is a three-dimensional integrated circuit, i.e. in the interior of the encapsulation of this integrated circuit, there are at least two electronic chips stacked one on top of the other in the vertical direction Z.

By way of illustration, the integrated circuit 4 comprises three electronic chips 22, 24 and 26.

Generally, an electronic chip comprises many active or passive electrical components in order to provide a preset function. An active electrical component is defined as being an electronic component that allows the power of a signal to be increased, for example its voltage or current or both. The additional power is supplied by a power supply. It is typically a question of components made from semiconductors such as transistors or thyristors. It may also be a question of an optoelectronic component. In contrast, a passive electronic component is defined as a component that does not allow the power of a signal to be increased. It is typically a question of a resistor, a capacitor or an inductor or a coil or even a diode or any combination of these components.

Electronic chips are also referred to as dies. Here, an electronic chip includes a front side, turned toward the substrate 10, and, opposite, a back side. These back and front sides extend essentially parallel to the plane of the substrate. Typically, the active or passive components of an electronic chip are produced in one of its front or back sides or even in the interior thereof. For example, in this embodiment, the active or passive components are produced in the front side of each chip. The front and back sides are each formed by a passivation layer through which electrical connection pads optionally pass. The passivation layer electrically insulates the chip from the exterior environment. The connection pads electrically and mechanically connect the chip to other chips of the integrated circuit 4 or to the substrate 10. These pads allow each chip to exchange electrical signals with these other chips or with the substrate 10.

Here, the front and back sides of the chips 22, 24 and 26 have been given the reference numbers 30 and 32, 34 and 36 and 38 and 40, respectively. More precisely, the front sides 30 and 34 are directly mechanically and electrically connected to the interior side 20 of the substrate 10 by electrical connection pads 42. For example, these electrical connection pads are also obtained by means of fusible micro-bumps or micro-pillars forming a BGA array. For example, the sides 30 and 34 each comprise a flat base from which the pads 42 protrude vertically.

The front side 38 of the chip 26 is directly mechanically and electrically connected to the back side 36 of the chip 24. For this purpose, in this embodiment, the front side 38 and the back side 36 each comprise pads 44 that face one another. In FIG. 1, the pads 44 belonging to the side 38 have not been distinguished from the facing pads belonging to the side 36. These pads 44 are micron-sized and also known as "micropillars". More precisely, these sides each comprise a flat base from which the pads 44 protrude vertically. Typically, the horizontal cross section of each pad 44 is constant over most of its height. The diameter of this horizontal cross section is generally comprised between 0.1 µm and 100 µm and, most often, between 5 µm and 30 µm or between 5 µm and 20 µm. Here, the diameter of the pads 44 is 20 µm and the spacing between the pads 44 is 50 µm. When the horizontal cross section of the pads 44 is not circular, the term "diameter" is understood to mean hydraulic diameter, the entirety of the perimeter of the horizontal cross section being considered to be wetted for this calculation. The height of each pad 44, measured from the flat base, is generally comprised between 1 µm and 200 µm and, most often, between 10 µm and 100 µm. These pads 44 are made of an electrically conductive material. Here, a material is considered to be electrically conductive if its electrical conductivity at 20° C. is higher than 1 S/m and, preferably, higher than $10^5$ or $10^7$ S/m. For example, the pads 44 are made of a metal such as copper. Other details on the pads 44 are given with regard to the process for fabricating the assembly 2.

The back sides 32 and 40 are located at the same height, i.e. in the same horizontal plane 46. The back side 36 is located at a much lower height than that of the back sides 32 and 40. For example, the back side 36 is located more than 50 µm or 100 µm below the plane 46.

Here, the chips 22 and 26 for example comprise MOS (Metal Oxide Semiconductor) transistors and are able to process electrical signals in order to perform arithmetic and logical calculations. The chips 22 and 26 therefore form heat sources when they are operated to perform calculations on the basis of delivered electrical signals. In the rest of this description, the expression "heat source" is understood to mean a zone of the integrated circuit dissipating a power per unit area higher than 1 W/cm$^2$. For example, here, the power per unit area dissipated by a heat source is equal to 5 W/cm$^2$ or 10 W/cm$^2$ or 50 W/cm$^2$.

The chip 24 comprises an optoelectronic component 48 such as a generator of a laser beam. For example, the component 48 is used to convert electrical signals into optical signals transmitted to the exterior of the integrated circuit 4. For this purpose, the integrated circuit 4 also comprises a connector 50 allowing an optical cable to be connected to the chip 24. The component 48 also forms a heat source when operated. Specifically, a substantial proportion of the electrical power used by this component 48 to generate the laser beam is dissipated in the form of heat.

The integrated circuit 4 comprises an encapsulation formed by a thick layer 54. The layer 54 protects the chips 22, 24 and 26 and the side 20 of the substrate from mechanical and chemical attacks originating from the exterior environment of the integrated circuit 4. For this purpose, it directly covers and coats:
 the side 20 of the substrate 10;
 the vertical sides of the chips 22, 24 and 26; and
 in this embodiment, a portion of the back side 36 of the chip 24.

The layer 54 also has a horizontal upper exterior side 56 turned away from the substrate 10. Here, the exterior side 56 is the side of the integrated circuit 4 on which the cooling system 6 is directly mounted. In order to improve the exchange of heat between the chips 22, 26 and the system 6, the plane 46 containing the sides 32 and 40 is located less than 50 µm and, typically, less than 10 µm under the exterior side 56. Preferably, as in this embodiment, the sides 32 and 40 are flush with the exterior side 56. Here, the exterior side 56 is therefore contained in the plane 46.

More precisely, the layer 54 protects the chips 22, 24 and 26 from moisture and mechanical shocks. For this purpose, as regards moisture, the layer 54 must provide a seal able to pass what is referred to as "damp heat" testing. Such a seal test is for example defined in the relevant JEDEC standard. This standard especially defines a test comprising the following steps:
1) characterizing the integrated circuit under standard conditions;
2) keeping the integrated circuit for hundreds of hours, typically more than 500 hours, at 85° C. under a humidity of 85%; then
3) characterizing the operation of the integrated circuit under standard conditions.

If the values measured in steps 1) and 3) above are equal within a preset margin of error defined in the JEDEC standard then the layer 54 is said to be seal-tight.

To protect the electronic chips from shocks, the thick layer is made of a material that makes it possible to distribute and decrease mechanical stresses between the chips 22, 24 and the substrate 10. For example, for this purpose, the Young's modulus at 25° C. of the layer 54 is chosen to be strictly lower than that of the chips 22 and 24. Typically, the Young's modulus of the chips 22, 24 is substantially equal to the Young's modulus of silicon. The Young's modulus of the layer 54 is then generally chosen to be lower than 100 GPa or 20 GPa at 25° C.

The layer 54 is also electrically insulating in order to electrically insulate the chips 22, 24 and 26 from the exterior environment. Here, a layer is considered to be electrically insulating if its conductivity at 20° C. is lower than $10^{-4}$ S/m and, preferably, lower than $10^{-7}$ or $10^{-10}$ S/m.

To achieve these results, generally, the layer 54 comprises a certain volume of polymer that varies from 5% to 100% of the total volume of the layer 54. The volume of polymer is often greater than 50% of the total volume. Typically, the polymer is uniformly distributed in the layer 54. It may for example be a question of an epoxy resin.

In addition, generally, the layer 54 has a low thermal conductivity, i.e. a thermal conductivity at 20° C. lower than 50 W·m$^{-1}$·K$^{-1}$ and, typically, lower than 15 W·m$^{-1}$·K$^{-1}$ or 5 W·m$^{-1}$·K$^{-1}$ or 2 W·m$^{-1}$·K$^{-1}$.

Given the low thermal conductivity of the thick layer 54 and the fact that the back side 36 is typically more than 50 µm distant from the exterior side 56, it is difficult to cool effectively the chip 24 using the cooling system 6. To prevent this problem, the integrated circuit 4 comprises a heat sink 60 interposed between the back side 36 and the exterior side 56.

The sink 60 is a block of highly thermally conductive materials having the function of forming a thermal bridge between the zone of the back side 36 that gets hottest and the exterior side 56. Here, the zone of the back side 36 that gets hottest is located vertically in line with the optoelectronic component 48. Below, the expression "good thermal conductor" is understood to mean a material or a block of material the thermal conductivity of which at 25° C., in the vertical direction, is at least two times higher than the thermal conductivity of the thick layer 54 measured under the same conditions and in the same direction. Preferably, the thermal conductivity of the sink 60 in the vertical direction is at least four, ten or fifty times higher than the thermal conductivity of the layer 54 in the same direction. Thus, typically, the thermal conductivity at 25° C. of the block 60 is higher than 10 W/m/K or 100 W/m/K and, preferably, higher than 200 W/m/K or 300 W/m/K.

The sink 60 provides no other function than that of a heat sink. Therefore, it is devoid of active or passive electronic components. In addition, it is preferably electrically insulated from the electronic chips and from the substrate 10 or else only electrically connected to the ground of the integrated circuit 4.

The sink 60 comprises a front side 62 facing the back side 36 and a back side 64 located opposite this front side 62. These sides 62 and 64 mainly extend horizontally. The area of the orthogonal projection of the front side 62 in a horizontal plane is larger than 10% and, preferably, larger than 20% or 40% of the area of the orthogonal projection of the back side 36 in the same plane.

The side 62 makes direct contact with the back side 36. Here, the side 62 comprises a flat horizontal base and pads 66 protruding vertically downward from this base. These pads 66 are designed to be mechanically and thermally connected to facing pads 44 of the back side 36. These pads 66 are structurally identical to the pads 44, except as regards their height which may be different to that of the pads 44. Here, the pads 66 are made of the same material as the pads 44, because copper is a good thermal conductor. However, other good thermal conductors may be used for the pads 66.

In this embodiment, only the end of the pads 66 makes direct mechanical contact with the back side 36. The number and dimensions of the pads 66 are set so that the area of the front side 62 making direct mechanical contact with the back side 36 is at least larger than 10 or 20%, and preferably larger than 35% or 45%, of the area of the orthogonal projection of this front side 62 in a horizontal plane. Here, the area of the front side 62 making direct mechanical contact with the back side 36 is comprised between 30% and 50% of the area of the orthogonal projection of the front side 62 onto a horizontal plane. Here, the pads 66 are 20 µm in diameter and are spaced apart from each other by a pitch of 50 µm.

The back side 64 is flat and horizontal. This back side is located on the same level as the back sides 32 and 40 of the chips 22 and 26 referred to as top chips. Here, a chip is a "top" chip if it possesses the back side furthest away from the interior side 10 of the substrate. With the exception of the one or more top chips, the other chips of the integrated circuit are referred to as "bottom" chips. Thus, here, the chip 24 is a bottom chip because it has a back side 68 closer to the interior side 10 than the sides 32 or 40. The expression "located on the same level" is understood to indicate that the side 64 is located between first and second horizontal planes located below and above the back side of the top chip, respectively. The height of the first plane is equal to the height H of the back side of the top chip minus 0.15×H or minus 0.1×H or minus 0.05×H (the symbol "×" signifying "multiplied by"). The height of the second plane is equal to the height H plus 0.15×H or plus 0.1×H or plus 0.05×H. The height H is the height of the back side of the top chip relative to the interior side 20 of the substrate 10. The height H is measured vertically. For example, the height of the back side 64 is equal to the height of the back side 32 or 40 to within plus or minus 10 µm or to within plus or minus 5 µm. By way of illustration, here, the height H is larger than or equal to 100 µm. In addition, advantageously, the back side 64 is comprised between the plane 46 and another horizontal plane located less than 50 µm or 10 µm under the plane 46. Preferably, as shown here, the back side 64 is flush with the exterior side 56. Here, it is therefore located in the plane 46.

The front side 62 and back side 64 are mechanically connected to each other by vertical sides. The height of the sink 60, measured between the flat base and the back side 64, is typically larger than 10 µm or 100 µm and generally smaller than 700 µm. Here, this height is comprised between 100 µm and 300 µm.

In order to ensure rapid dissipation of the heat toward the cooling system 6, the sink 60 must rapidly conduct the heat while not storing it too much. The sink 60 therefore contains no PCMs (phase change materials). For this purpose, the material from which the body of the sink is made represents a specific heat capacity, measured under standard conditions for temperature and pressure, of lower than 1250 J/Kg/K or of lower than 1000 J/Kg/K or even of lower than 750 J/Kg/K. The body of the sink 60 is the portion located between the flat base of the front side 62 and the back side 64, i.e. the sink without the pads 66. Here, this body is a thermally uniform block made of a single material. The body of the sink 60 is not necessarily made of the same material as the pads 66. Here, it is made of silicon or aluminum.

In order to improve the thermal conduction between the front side 62 and the back side 36, the gaps between the pads 44 and 66 are filled with an adhesive 68 made of an bonding material that is a good thermal conductor. For example, this bonding material comprises a polymer blended with particles made of a good thermal conductor. For example, the particles are metal particles such as particles of copper or silver. The particles may also be graphene or graphite particles or particles of other materials such as silicon oxide. These particles generally take the form of nanoparticles, i.e. particles the largest length of which is smaller than 1 µm and, typically, smaller than 100 nm or 10 nm.

The cooling system 6 comprises a radiator 70. This radiator 70 possesses a flat side making direct mechanical and thermal contact with the exterior side 56. This flat side covers the back sides 32, 40 and 62 in their entirety. Opposite the flat side, the radiator 70 has a flat base from which fins 72 protrude in order to increase the area of contact between this radiator 70 and the exterior medium, and thus promote the exchange of heat by conduction with this exterior medium.

The integrated circuit 4 operates in the following way. When the component 48 is in operation, it generates heat. This heat diffuses preferentially by conduction from the back side 36 to the front side 62 of the sink 60, then from the front side 62 as far as the back side 64 and, lastly, from the back side 64 to the radiator 70. The presence of the sink 60 accelerates the exchange of heat between the back side 36 and the radiator 70. This makes it possible to keep the back side 36 at a temperature T1 very much lower than that that would be observed in the absence of the sink 60. Simulations have shown that, in normal operation, the temperature T1 is at least 10° C. or 20° C., or even at least 50° C. below the temperature that would be observed under the same conditions and in an identical integrated circuit devoid of a sink 60.

A process for fabricating the assembly 2 will now be described with reference to FIGS. 2 to 13.

The process starts with wafer-scale fabrication of the sink 60. More precisely, in a step 90 (FIG. 3), a silicon wafer 92 is provided then oxidized to form on this wafer a layer 94 of silicon oxide.

In a step 96 (FIG. 4), a tie layer and a nucleation layer are deposited on the layer 94. In FIG. 4, these layers are represented by one and the same layer 98. The tie layer is for example made of titanium or titanium nitride and the nucleation layer is here made of copper.

In a step 100 (FIG. 5), a layer 102 of resist is deposited on the layer 98 then structured by photolithography in order to form locations 104 in which the layer 98 is directly exposed to the exterior.

In a step 106 (FIG. 6), copper pads are grown by electrolysis from the bottom of the locations 104. The free end of each copper pad is then covered with a finishing layer 110 made of a melt-flow material. Here, the melt-flow material is an SnAg alloy. The pads 66 are thus obtained. In the figures, the number of pads 66 shown has been limited in order to simplify the graphical illustrations.

In a step 112 (FIG. 7), a heat treatment is used to shape the SnAg alloy. This makes it possible to prevent this metal alloy from flowing over the vertical edges of the pads 66 in the subsequent melt-flow step.

In a step 114 (FIG. 8), the layer 102 of resist is removed, by dissolving for example.

In a step 116 (FIG. 9), the silicon wafer 92 is cut in order to mechanically separate from one another the various sinks 60 that were up to this point processed on the wafer scale.

Figures 9, 10, 11, 12, 13, 14:
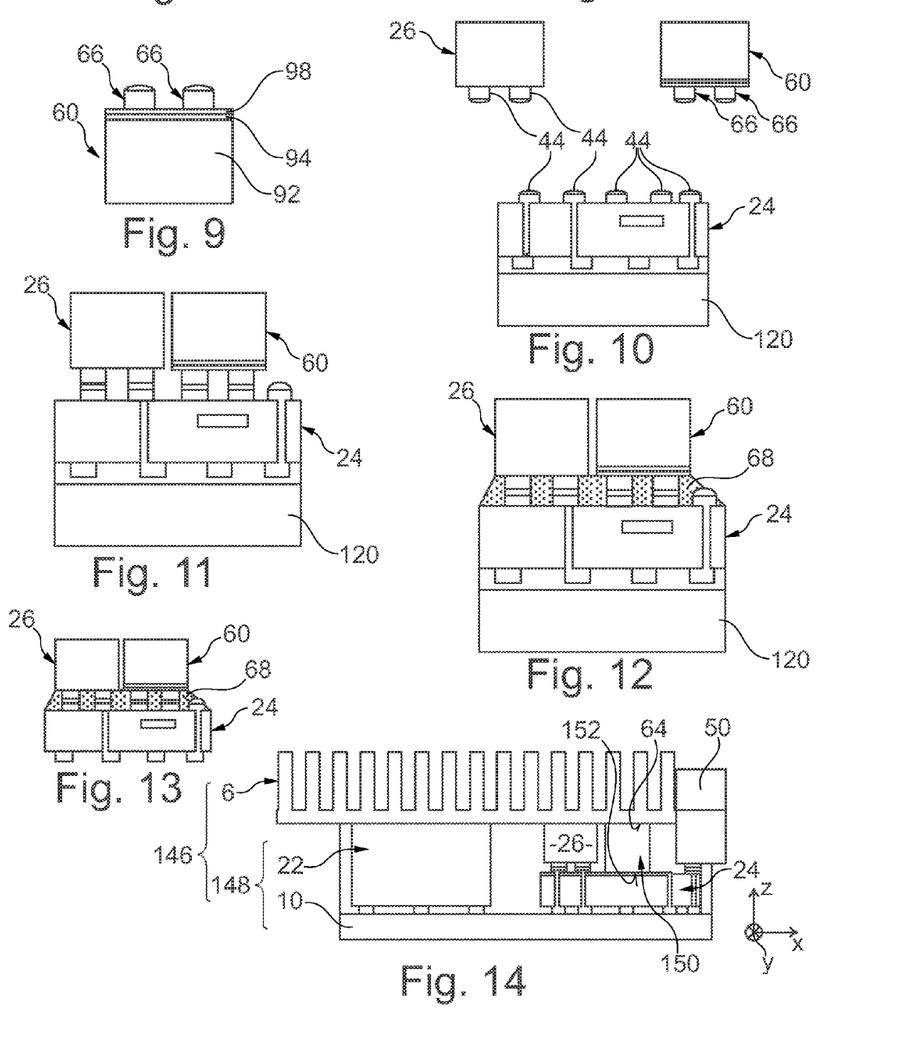
FIG. 14 is a schematic illustration of a vertical cross section through a second embodiment (not claimed) of an assembly comprising an integrated circuit and a system for cooling this integrated circuit.
Figure 15:
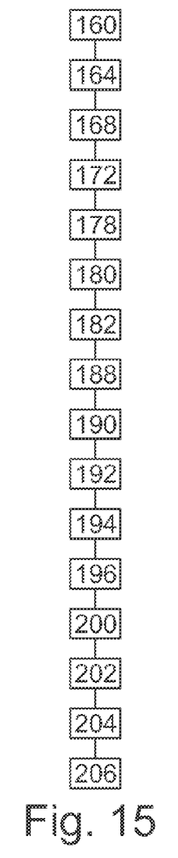
FIG. 15 is a flowchart of a process for fabricating the assembly in FIG. 14.
Figure 16:
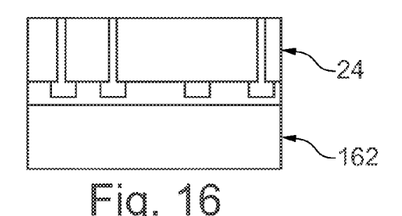
FIGS. 16 to 27 are schematic illustrations of vertical cross sections illustrating various steps of the process in FIG. 15.
Figure 17:
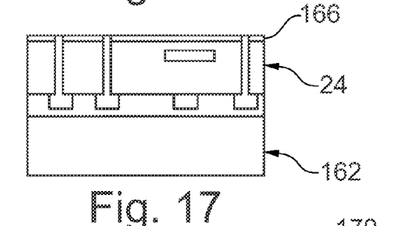
Figure 18:
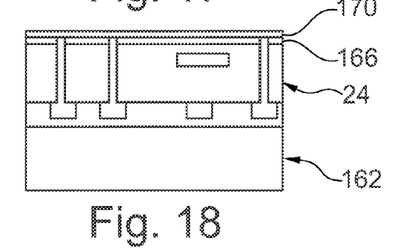
Figure 19:
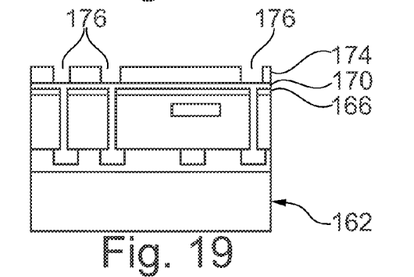
Figure 20:
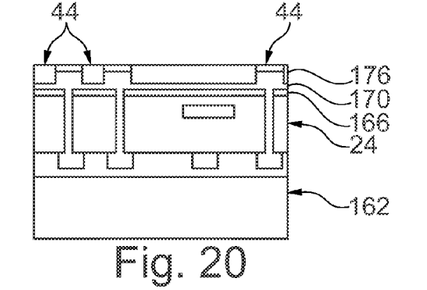
Figure 21:
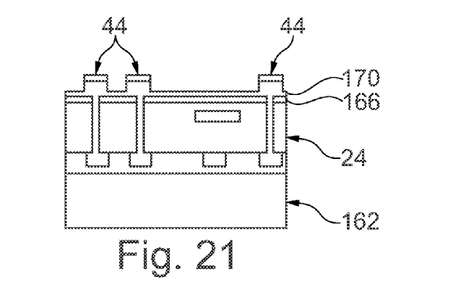
Figure 22:
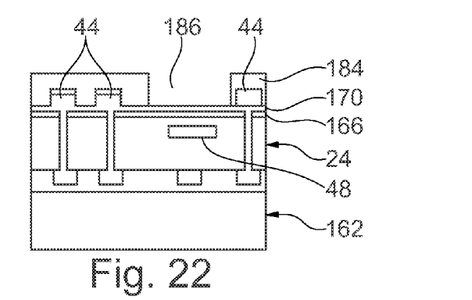
Figure 23:
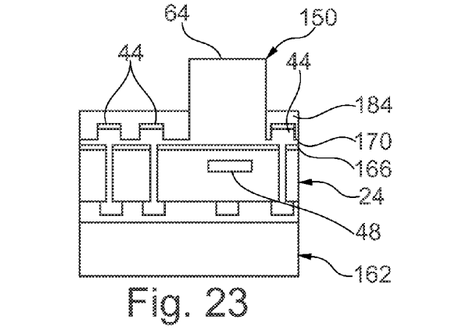
Figure 24:
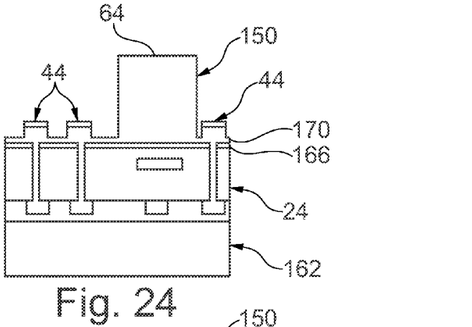
Figure 25:
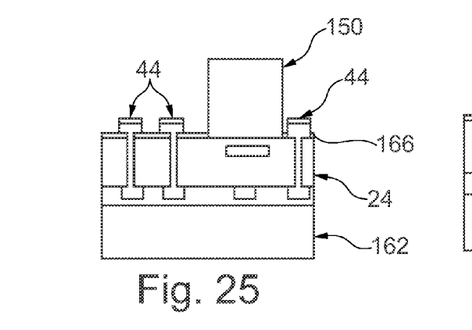
Figure 26:
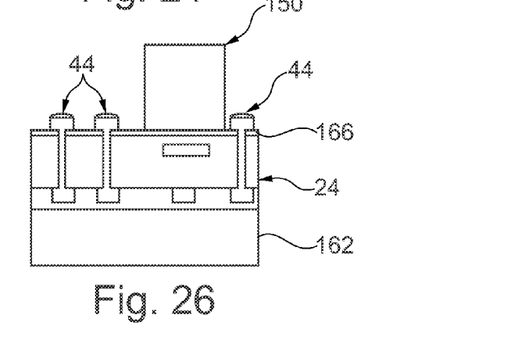
Figure 27:
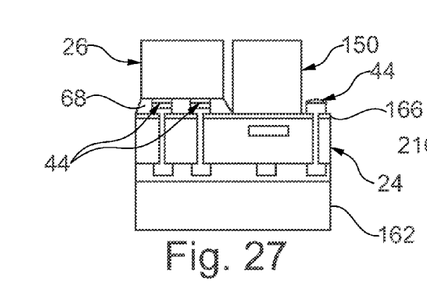

In a step 118 (FIG. 10), the sink 60 and the chip 26 are assembled and added to the back side 36 of the chip 24. For this purpose, the chip 26 and the sink 60 are placed on the back side 36 using the same pick and place process. In step 118, this step is carried out on a wafer containing a plurality of chips 24 so as to stack, on the wafer scale, one chip 26/sink 60 assembly on each of a plurality of chips 24. To stiffen the wafer containing the various chips 24, a temporary substrate or temporary handle 120 is bonded to this wafer. In FIG. 10, only one chip 24 of this wafer is shown.

In a step 122 (FIG. 11), a heat treatment is applied in order to make the SnAg alloy flow. This allows the pads 44 and 66 to be mechanically soldered together. This mechanical connection also allows an electrical and thermal connection to be obtained between these pads. The heat treatment is applied simultaneously to the pads 44 of the chips 24 and 26 and to the pads 66 of the sink 60. Thus, the chip 26 and the sink 60 are mechanically fastened to the back side 36 of the chip 24 in a single operation.

In a step 124 (FIG. 12), the adhesive 68 is dispersed between the pads 44 and 66 in order to fill completely the gaps located between these pads. This improves the mechanical withstand of the sink 60 on the back side 36 of the chip 24. This also improves the thermal connection of the sink 60 to the back side 36. Optionally, as illustrated here, the same adhesive 68 is also dispersed between the chips 24 and 26.

In a step 128 (FIG. 13), the temporary handle 120 is debonded, then the wafer holding the various chips 24 is singulated so as to isolate mechanically from one another subassemblies each comprising a chip 24 to which a chip 26 and a sink 60 are fastened.

Next, in a step 130, a subassembly obtained in step 128 is soldered to the substrate 10. In this step 130, the chip 22 is also soldered to the substrate 10. The subassembly and the chip 22 are, for example, placed, in this step 130, on the substrate 10 using the same pick and place process.

In a step 132, the thick layer 54 is molded onto the substrate 10 and the chips 22, 24 and 26 and the sink 60, so as to encapsulate the integrated circuit 4.

Lastly, in a step 134, the cooling system 6 is directly fastened to the exterior side 56 of the integrated circuit 4.

FIG. 14 shows an identical assembly 146 to the assembly 2, except that the integrated circuit 4 is replaced by an integrated circuit 148. The integrated circuit 148 is identical to the integrated circuit 4, except that the sink 60 has been replaced by a sink 150. The sink 150 differs from the sink 60 only in that:

the front side 62 is replaced by a flat front side 152; and the body of the sink 150 is made of copper and not of silicon.

In this embodiment, the front side 152 is devoid of pads 66. The front side 152 makes direct mechanical contact with the back side 36 of the chip 24 over its entire area. For this purpose, the front side 152 is applied to a flat zone of the back side 36, i.e. a zone of the back side 36 devoid of pads 44.

A process for fabricating the assembly 146 will now be described with reference to FIGS. 15 to 27.

In a step 160 (FIG. 16), a wafer in which a plurality of electronic chips 24 have been fabricated on the wafer scale is provided. This wafer is bonded to a temporary handle 162. In order to simplify the figures, only one portion of this wafer, containing only a single chip 24, is shown.

In a step 164 (FIG. 17), the fabrication of the chip 24 is completed with the deposition of a passivation layer 166 in order to form the back side 36 of the chip 24. The layer 166 is made of an electrically insulating material and covers all of the back of the chip 24, except for those locations where pads 44 must be produced.

In a step 168 (FIG. 18), a tie layer and a nucleation layer are deposited. This step is for example identical to the step 96 of the process in FIG. 2. In the figures, these two layers are represented by a single layer 170.

In a step 172 (FIG. 19), a resist layer 174 is deposited, then structured by photolithography in order to form locations 176. At the bottom of each location 176, a portion of the layer 170 is directly exposed to the exterior.

In a step 178 (FIG. 20), the locations 176 are filled, by electrolysis, with copper, then surmounted by a melt-flow layer made of SnAg in order to form the pads 44 of the back side 36 of the chip 24.

In a step 180 (FIG. 21), the resist layer 176 is removed, by dissolving for example.

In a step 182 (FIG. 22), a new resist layer 184 is deposited, then structured by photolithography in order to produce a location 186 above the component 48. The location 186 allows only that portion of the layer 170 which is located directly above the component 48 to be exposed to the exterior.

In a step 188 (FIG. 23), a copper layer is deposited and grown, by electrolysis, only inside the location 186. The growth of this copper layer is stopped when the thickness of this layer is such that the back side 64 is located at the same height as the back sides 32 and 40 of the electronic chips 22 and 26 when the chips 22, 24, 26 and the sink 150 are assembled on the substrate 10. After step 188, the fabrication of the sink 150 and its fastening to the chip 24 are over.

In a step 190 (FIG. 24), the resist layer 184 is removed, by dissolving for example.

In a step 192 (FIG. 25), the layer 170 located between the pads 44 is removed by etching.

In a step 194 (FIG. 26), a heat treatment, identical to that of step 112, is applied in order to shape the pads 44.

In a step 196 (FIG. 27), the electronic chip 26 is assembled on the back side 36. This step 196 is carried out in the same way as was described with reference to steps 118, 122 and 124 of the process in FIG. 2. However, it will be noted that in this embodiment the adhesive 68 is only dispersed between the pads 44 located under the chip 26.

Next, steps 200, 202, 204 and 206 are carried out, these steps being identical to steps 128, 130, 132 and 134 of the process in FIG. 2, respectively.

Figure 28:
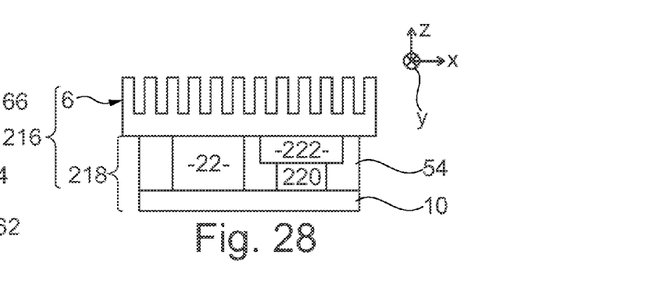
FIG. 28 is a schematic illustration of a third embodiment (not claimed) of an assembly comprising an integrated circuit and a system for cooling this integrated circuit.

FIG. 28 shows an assembly 216 that is identical to the assembly 2 except that the integrated circuit 4 is replaced by an integrated circuit 218. This integrated circuit 218 differs from the integrated circuit 4 in that the chip 24 and the sink 60 are replaced by an electronic chip 220 and a sink 222, respectively. The sink 222 is identical to the sink 150 except that it is wider than the electronic chip 220. Therefore, its front side extends, in a horizontal direction, and on each side, beyond the back side of the chip 220. Such an arrangement of the sink 222 in addition promotes dissipation of the heat generated by the chip 220 via the vertical sides of the integrated circuit 218. In this embodiment, for example, the sink 222 possesses a flat front side devoid of pads, which is directly bonded to the back side of the electronic chip 220. In this case, the back side of the electronic chip 220 is also flat and horizontal. The adhesive used to produce this bond is for example the adhesive 68. Typically, the area of the front side of the sink 222 is at least 1.1 times and, preferably, 1.5 or 2 times larger than the area of the back side of the chip 220.

Many other embodiments are possible. For example, as a variant, the chip 26 is omitted. In this case, the height of the sink 60 is adjusted so that its back side is at the same height as the back side 32 of the chip 22. In another embodiment, the chip 22 is omitted.

The above description applies to any integrated circuit comprising a plurality of electronic chips the back sides of which are located at different heights. In the case where the integrated circuit comprises a plurality of chips each having a back side at a height higher than that of the back side 36, preferably, the back side 64 of the sink is located level with the back side of the top electronic chip. It will also be noted that the chip 24 may be replaced by another chip devoid of optoelectronic components.

The back side of an electronic chip or of the sink does not necessarily need to be flat and horizontal. For example, it may contain asperities. In this case, the plane of the back side used to measure the height H is the horizontal plane that minimizes the root mean square of vertical deviations between this plane and each point on this back side.

The integrated circuit may also contain a plurality of sinks such as the sinks 60, 150 or 222. For example, a plurality of sinks may be placed on various respective zones of the same back side of an electronic chip. It is also possible to place a plurality of sinks on respective back sides of a plurality of different electronic chips.

The electrical connections 12 may take other forms. For example, as a variant, the electrical connections 12 are pins that protrude beyond the encapsulation of the integrated circuit 4.

The electronic components of a chip need not only be produced on the front side of this chip. For example, as a variant, the electronic components are also produced on the back side or in the bulk of the electronic chip.

The body of the sink may be made of other materials that are good thermal conductors, including in the case of the sink 60. For example, this body may be made of copper or aluminum.

The body of the sink does not necessarily consist of a single layer between its front and back sides. Thus, as a variant, the body consists of a stack of a plurality of layers made of materials that are good thermal conductors, said layers being deposited directly on one another in the vertical direction. For example, this stack comprises at least one silicon layer and at least one silicon carbide layer. In another embodiment, this stack comprises at least one graphite layer. As a variant, one of the layers may also be a graphene layer in order to increase the lateral conductivity of the sink.

In another embodiment, the back side of the sink is not flush with the upper exterior side 56, but buried under a thin strip of the thick layer 54. Typically, the thickness of this strip of thick layer is smaller than 50 μm and, preferably, smaller than 10 μm or 5 μm.

The front side of the sink may be fastened to the back side of the electronic chip by other means. For example, as a variant, the pads 44 and 66 are omitted and the front side is fastened to the back side only by means of an adhesive, such as the adhesive 68. In this case, the front side does not make direct mechanical contact with the back side of the electronic chip.

The thermally conductive particles mixed with the bonding materials in the adhesive 68 may be omitted.

Likewise, the adhesives dispensed under the chip 26 and under the sink may be different. For example, the adhesive dispensed only under the chip 26 may have a lower thermal conductivity than that dispensed under the sink.

In the case where the sink is mechanically and thermally fastened to the chip 24 via pads, the adhesive dispensed between these pads may be omitted.

Other systems for cooling the upper exterior side of the integrated circuit are possible. For example, a fluidic cooling system comprising channels that deliver a heat-transfer fluid into direct contact with the side 56, and channels that evacuate this heat-transfer fluid after it has been heated by thermal conduction with this side 56, may be used.

As a variant, the step of removing the residual layer 170 between the pads 44 is omitted.

The invention claimed is:

1. An integrated circuit comprising:
a substrate that extends mainly in a plane of the substrate, the substrate being equipped with electrical connections for electrically connecting the integrated circuit to an exterior electronic circuit and having an interior side;
a top electronic chip and a bottom electronic chip, each of said electronic chips being electrically connected to the electrical connections by way of the substrate and each electronic chip comprising a front side turned toward the interior side of the substrate and a back side opposite the front side, the back side of the top electronic chip being located at a height H above the interior side of the substrate and being further from the interior side of the substrate than the back side of the bottom electronic chip;
an encapsulation formed by a thick layer made of an electrically insulating material that coats the electronic chips, the thick layer forming an upper exterior side of the encapsulation parallel to the plane of the substrate; and
a heat sink devoid of electronic components and interposed between the back side of the bottom electronic chip and the upper exterior side of the encapsulation, the heat sink comprising a front side placed on the back side of the bottom electronic chip and a back side opposite the front side, the back side being between a first and a second plane, which first and second planes are parallel to the plane of the substrate, these first and second planes being located 0.15×H below and 0.15×H above the back side of the top electronic chip, respectively,
the thermal conductivity at 25° C. of the heat sink in a direction perpendicular to the plane of the substrate being at least two times higher than the thermal conductivity of the thick layer measured under the same conditions and in the same direction;
wherein:
the back side of the bottom electronic chip comprises pads; and
the front side of the heat sink comprises pads that are mechanically fastened to facing pads of the back side of the bottom electronic chip.

2. The integrated circuit as claimed in claim 1, in which:
the front side of the top electronic chip comprises pads, said pads being directly mechanically and electrically connected to facing pads so as to transmit electrical signals between the top electronic chip and an electronic circuit exterior to the top electronic chip by way of said pads; and the pads of the front side of the heat sink are mechanically fastened to facing pads of the back side of the bottom electronic chip in the same way as the pads of the front side of the top electronic chip are fastened to the facing pads.

3. The integrated circuit as claimed in claim 2, in which the front sides of the sink and top electronic chip each comprise a flat base from which the pads protrude.

4. The integrated circuit as claimed in claim 1, in which the pads are made of metal.

5. The integrated circuit as claimed in claim 1, in which the portion of the front side of the heat sink making direct mechanical contact with the back side of the bottom electronic chip occupies at least 10% of the area of the orthogonal projection of the back side of the bottom electronic chip onto the plane of the substrate.

6. The integrated circuit as claimed in claim 5, in which the area of the orthogonal projection of the front side of the heat sink onto the plane of the substrate is at least 1.1 times larger than the area of the orthogonal projection of the back side of the bottom electronic chip onto the same plane.

7. The integrated circuit as claimed in claim 1, in which the specific heat capacity of the heat sink is lower than 1200 J/Kg/K or 1000 J/Kg/K under standard conditions for temperature and pressure.

8. The integrated circuit as claimed in claim 1, in which the thickness of the heat sink in a direction perpendicular to the plane of the substrate is larger than 70 μm.

9. The integrated circuit as claimed in claim 1, in which the back side of the top electronic chip and the back side of the heat sink are flush with the upper exterior side of the encapsulation.

10. The circuit as claimed in claim 1, in which the portion of the front side of the heat sink making direct mechanical contact with the back side of the bottom electronic chip occupies at least 30% of the area of the orthogonal projection of the back side of the bottom electronic chip onto the plane of the substrate.

11. An assembly comprising:
an integrated circuit having an upper exterior side; and
a fluidic cooling system using a heat-transfer fluid to cool the upper exterior side of the integrated circuit, the fluidic cooling system being placed directly on the upper exterior side of the integrated circuit;
wherein the integrated circuit is as claimed in claim 1.

12. The assembly as claimed in 11, in which the fluidic cooling system includes a radiator.

13. A process for fabricating an integrated circuit as claimed in claim 1, wherein the process comprises producing the heat sink interposed between the back side of the bottom electronic chip and the upper exterior side of the encapsulation.

14. The process as claimed in claim 13, in which the heat sink is added to the back side of the bottom electronic chip by way of pads.

15. The process as claimed in claim 14, wherein once the heat sink has been added to the back side of the bottom electronic chip and fastened to this bottom electronic chip by pads, the process comprises a step of filling the space created by the pads with an adhesive containing thermally conductive particles.

* * * * *